United States Patent
Noonan

(10) Patent No.: US 9,788,459 B2
(45) Date of Patent: Oct. 10, 2017

(54) THERMAL STAND-OFF WITH TORTUOUS SOLID-WALL THERMAL CONDUCTION PATH

(71) Applicant: Aerojet Rocketdyne, Inc., Sacramento, CA (US)

(72) Inventor: Kevin Mark Noonan, Sacramento, CA (US)

(73) Assignee: AEROJET ROCKETDYNE, INC., Rancho Cordova, CA (US)

( * ) Notice: Subject to any disclaimer, the term of this patent is extended or adjusted under 35 U.S.C. 154(b) by 711 days.

(21) Appl. No.: 14/219,041

(22) Filed: Mar. 19, 2014

(65) Prior Publication Data
US 2015/0271955 A1 Sep. 24, 2015

(51) Int. Cl.
*F28F 13/00* (2006.01)
*H05K 7/20* (2006.01)

(52) U.S. Cl.
CPC ......... *H05K 7/20436* (2013.01); *F28F 13/00* (2013.01); *F28F 2013/006* (2013.01); *F28F 2270/00* (2013.01)

(58) Field of Classification Search
None
See application file for complete search history.

(56) References Cited

U.S. PATENT DOCUMENTS

| | | | | |
|---|---|---|---|---|
| 3,282,011 A | * | 11/1966 | Meserole et al. | F16L 59/021 138/148 |
| 3,958,714 A | * | 5/1976 | Barriere et al. | F16L 59/06 220/592.2 |
| 4,746,223 A | * | 5/1988 | Miyata et al. | F16T 1/48 137/187 |
| 5,003,744 A | * | 4/1991 | Taylor | E04C 2/546 52/308 |
| 6,002,588 A | * | 12/1999 | Vos et al. | F16F 7/14 174/138 G |
| 6,144,030 A | * | 11/2000 | Ray et al. | G01J 5/20 250/338.4 |
| 6,493,233 B1 | * | 12/2002 | De Lorenzo et al. | H05K 3/325 174/138 G |
| 7,244,935 B2 | * | 7/2007 | Yon et al. | B81B 3/0081 250/338.1 |
| 7,836,944 B2 | * | 11/2010 | Antonijevic et al. | F16L 9/19 138/38 |

(Continued)

FOREIGN PATENT DOCUMENTS

EP 0425499 1/1998

*Primary Examiner* — Allen Flanigan
(74) *Attorney, Agent, or Firm* — Joel G Landau

(57) ABSTRACT

A thermal stand-off includes a rigid thermal stand-off section within a spatial region that extends along a distance between a first location and second, opposed location. The rigid thermal stand-off section includes a tortuous solid-wall thermal conduction path that extends from the first location to the second location. The tortuous solid-wall thermal conduction path is longer than the distance of the spatial region. The tortuous solid-wall thermal conduction path can include a tensile spring constant that is greater than a maximum tensile spring constant of a coil spring that fits in the same spatial region and is formed of the same material composition. The tortuous solid-wall thermal conduction path can include an antegrade section and, relative the antegrade section, a retrograde section.

2 Claims, 1 Drawing Sheet

(56) References Cited

U.S. PATENT DOCUMENTS

| | | |
|---|---|---|
| 8,535,048 B2 | 9/2013 | Dezon-Gaillard et al. |
| 2004/0188615 A1* | 9/2004 | DeFlumere ............... G01J 5/02 |
| | | 250/338.1 |
| 2014/0177166 A1* | 6/2014 | Nardi et al. ........ H01L 23/3672 |
| | | 361/679.54 |

* cited by examiner

THERMAL STAND-OFF WITH TORTUOUS SOLID-WALL THERMAL CONDUCTION PATH

STATEMENT REGARDING FEDERALLY SPONSORED RESEARCH OR DEVELOPMENT

This invention was made with Government support under contract HQ0147-13-C-0005 awarded by the U.S. Missile Defense Agency. The Government has certain rights in the invention.

BACKGROUND

Components that are to be exposed to elevated temperature environments can be fabricated from high thermal resistance materials to protect the component against the temperature for a given expected exposure time. Ancillary components may not be directly exposed in the elevated temperature environment but can experience similar temperatures from thermal conduction and thus also require the use of high thermal resistance materials. The use of the high thermal resistance materials can add cost and complexity to the component design.

SUMMARY

A thermal stand-off according to an example of the present disclosure includes a rigid thermal stand-off section within a spatial region that extends along a distance between a first location and second, opposed location. The rigid thermal stand-off section includes a tortuous solid-wall thermal conduction path that extends from the first location to the second location. The tortuous solid-wall thermal conduction path is longer than the distance of the spatial region.

In a further embodiment of any of the foregoing embodiments, the tortuous solid-wall thermal conduction path is longer than the distance of the spatial region by a factor of at least two.

In a further embodiment of any of the foregoing embodiments, the rigid thermal stand-off section includes at least one of open space, low-vacuum space, and a phase change material, located between sections of the tortuous solid-wall thermal conduction path.

In a further embodiment of any of the foregoing embodiments, the rigid thermal stand-off section includes open space between sections of the tortuous solid-wall thermal conduction path.

In a further embodiment of any of the foregoing embodiments, the rigid thermal stand-off section includes low-vacuum space between sections of the tortuous solid-wall thermal conduction path.

In a further embodiment of any of the foregoing embodiments, the rigid thermal stand-off section includes a phase change material between sections of the tortuous solid-wall thermal conduction path.

A further embodiment of any of the foregoing embodiments includes a sleeve extending around the rigid thermal stand-off section, the sleeve extending from one side of the rigid thermal stand-off section at least partially over the length.

A further embodiment of any of the foregoing embodiments includes a sleeve extending around the rigid thermal stand-off section and partially over the length, the sleeve extending from a connected base at the one side of the rigid thermal stand-off section to a free end distal from the one side of the rigid thermal stand-off section.

A further embodiment of any of the foregoing embodiments includes a connector interface extending from the rigid thermal stand-off section.

In a further embodiment of any of the foregoing embodiments, the tortuous solid-wall thermal conduction path is formed of a metal-based material.

In a further embodiment of any of the foregoing embodiments, the tortuous solid-wall thermal conduction path has a tensile spring constant that is greater than a maximum tensile spring constant of a coil spring fitting within the same spatial region and formed of the same material composition as the tortuous solid-wall thermal conduction path.

In a further embodiment of any of the foregoing embodiments, the tortuous solid-wall thermal conduction path includes an antegrade section and, relative the antegrade section, a retrograde section.

A thermal stand-off according to an example of the present disclosure includes a thermal stand-off section within a spatial region extending along a distance between a first location and second, opposed location. The thermal stand-off section includes a tortuous solid-wall thermal conduction path that extends from the first location to the second location. The tortuous solid-wall thermal conduction path is longer than the distance of the spatial region. The tortuous solid-wall thermal conduction path has a tensile spring constant that is greater than a maximum tensile spring constant of a coil spring fitting within the same spatial region and formed of the same material composition as the tortuous solid-wall thermal conduction path.

In a further embodiment of any of the foregoing embodiments, the tortuous solid-wall thermal conduction path is non-singlehelical.

In a further embodiment of any of the foregoing embodiments, the tensile spring constant is greater than the maximum tensile spring constant of the coil spring by a factor of at least one-hundred.

A thermal stand-off according to an example of the present disclosure includes a thermal stand-off section within a spatial region extending along a distance between a first location and second, opposed location. The thermal stand-off section includes a tortuous solid-wall thermal conduction path that extends from the first location to the second location. The tortuous solid-wall thermal conduction path is longer than the distance of the spatial region and including an antegrade section and, relative the antegrade section, a retrograde section.

In a further embodiment of any of the foregoing embodiments, the antegrade section and the retrograde section provide a back turn with respect to a reference start location at the first location and a reference end location at the second location.

In a further embodiment of any of the foregoing embodiments, the thermal stand-off section is rigid.

In a further embodiment of any of the foregoing embodiments, the tortuous solid-wall thermal conduction path has a tensile spring constant that is greater than a maximum tensile spring constant of a coil spring fitting within the same spatial region and formed of the same material composition as the tortuous solid-wall thermal conduction path.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
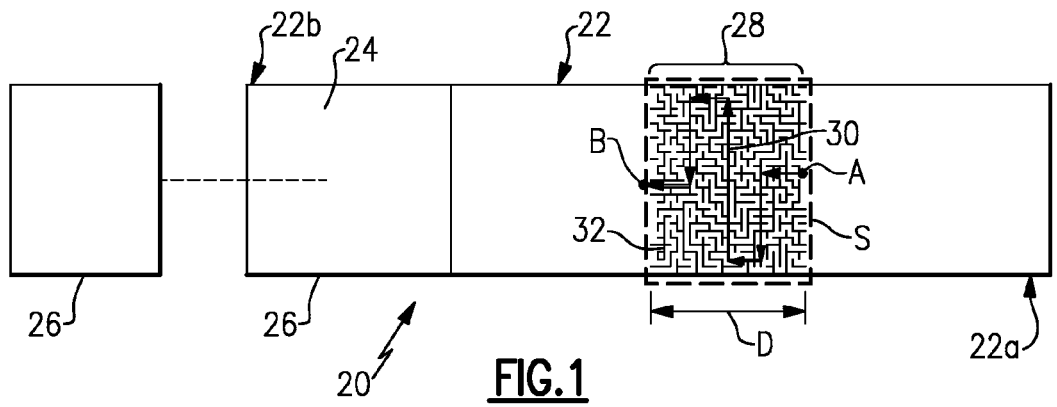
FIG. 1 illustrates an example article having a thermal stand-off section that includes a tortuous solid-wall thermal conduction path.

FIG. 1 schematically illustrates an example article 20. Generally, the article 20 can be an adapter, or a portion thereof, that has one or more connectors that can join to a corresponding mating connector of at least one other component. In some examples, the article 20 may include multiple connectors for joining multiple components together. As will be appreciated, the article 20 and examples herein are applicable to joining with, or joining together, a variety of different components but are not limited to adapters and will also be of benefit to other types of components. In particular, as will be described in further detail, the thermal stand-off of this disclosure can facilitate thermal isolation and also serve as a force transmission devise (structural member) that transmits axial loads (tensile or compressive), moments, torsional loads, or any combination thereof.

As shown in FIG. 1, the article 20 includes a thermal stand-off 22 that extends between a first end 22a and a second end 22b. In this example, the thermal stand-off 22 is depicted as a distinct piece, although it is to be understood that the thermal stand-off 22 could alternatively be integrated with or into other components. In the illustrated example, the second end 22b of the thermal stand-off 22 includes a connector interface 24 that can be configured to interface with a corresponding connector interface of a component 26. For example only, the connector interface 24 could be a male or female interface, a threaded interface, an interlocking interface, a geared or toothed interface, or the like, which is configured to mate with and temporarily or permanently join to the corresponding connector interface of component 26. As can be appreciated, the connector interface 24 could alternately be located at the first end 22a, or each of the ends 22a/22b could include respective connector interfaces 24, which can be the same or different types of connector interfaces. As can be appreciated, other implementations of the thermal stand-off 22 can exclude any such connector interfaces.

The thermal stand-off 22 includes a rigid thermal stand-off section 28 between the first and second ends 22a/22b. The rigid thermal stand-off section 28 is situated within a spatial region, represented at S, which extends over a distance D between first and second locations represented at "A" and "B." The spatial region is the volume bounded by the periphery of the rigid thermal stand-off section 28. For example, the spatial region can be cylindrical or polygonal, but is not limited to such geometries. In this example, the distance D is a linear length, although if the article 20 instead had a curved geometry the distance D could be an arc length or a mean center line, for example. In this example, the rigid thermal stand-off section 28 supports the first end 22a with respect to the second end 22b (or vice versa). In some examples, the rigid thermal stand-off section 28 can be the exclusive weight-bearing support of the first end 22a with respect to the second end 22b.

The rigid thermal stand-off section 28 includes a tortuous solid-wall thermal conduction path, which is represented at 30. The tortuous solid-wall thermal conduction path 30 is formed by solid walls 32, which are schematically shown in FIG. 1. For example, the solid walls 32 can be formed of a metal-based material, such as a metal alloy. Example metal alloys can include titanium alloys and superalloys, but are not limited to these alloys. In medium or low temperature end-uses, the solid walls 32 can alternatively be formed of, or include, a polymeric material, such as a thermoplastic- or thermoset-based material. In further examples, the remainder of the thermal stand-off 22 is formed of the same material as the rigid thermal stand-off section 28.

The solid walls 32 extend in a circuitous path within the spatial region S between the first and second locations A, B. The tortuous solid-wall thermal conduction path 30 provides a thermal conduction path distance, which in this example is the distance along the path 30 from point A at one side of the rigid thermal stand-off section 28, or a point even therewith, to point B at the other side of the thermal stand-off section 28, or a point even therewith. The thermal conduction path distance is thus a distance over which heat must conduct across the rigid thermal stand-off section 28, going only through solid material, which is the primary mode of thermal conductivity.

The thermal conduction path distance is greater than the distance D of the spatial region, which in this example is the linear distance between points A and B. For example, if the volume of the spatial region of the thermal stand-off section 28 were instead entirely solid, there would be a linear thermal conduction path between points A and B, and the path distance would thus be equal to the linear distance. However, the thermal conduction path distance of the rigid thermal stand-off section 28 is greater than the distance of the spatial region by a factor of greater than one and, in further examples, by a factor of at least two or at least four for an even greater thermal isolation effect.

As a result of the relatively long thermal conduction path distance provided by the tortuous solid-wall thermal conduction path 30, heat that is conducted through the thermal stand-off 22 from the first end 22a to the second end 22b, or vice versa depending on the particular design and implementation, is conducted primarily through the solid portions of the thermal stand-off 22. In the rigid thermal stand-off section 28, the solid portions are the solid walls 32 that form the tortuous solid wall thermal conduction path 30. The volume between the solid walls 32 can be open space, as will be discussed in further examples below.

The solid walls 32, and thus the tortuous solid wall thermal conduction path 30, can be designed to have a particular thermal conduction path distance and cross-sectional area to provide a resulting degree of thermal separation between the first and second ends 22a/22b. In this regard, the solid walls 32 of the thermal stand-off section 28 can be designed to have a labyrinth or maze-like geometry, multihelical geometry (e.g., a double helix, triple helix, etc.), non-singlehelical geometry (i.e., a single helical coil), or other geometry that provides a thermal conduction path distance that is greater than the distance D of the spatial region. The labyrinth, maze-like geometry, or other circuitous path design of the solid walls 32 can be defined by a computer-aided design and, in this regard, has a defined, non-random geometry.

In further examples, the size and geometry of the solid walls 32 of the tortuous solid wall thermal conduction path 30 can also be designed with respect to a target rigidity of the rigid thermal stand-off section 28. For example, the term "rigid" refers to the quality of being stiff, unyielding, not pliant or flexible.

In a further example, the rigidity of the rigid thermal stand-off section 28 is represented with respect to a coil spring of the same material that fits within the same spatial region. For instance, the tortuous solid wall thermal conduction path 30 has a tensile spring constant that is greater than a maximum tensile spring constant of a coil spring that fits within the same spatial region and is formed of the same material composition as the tortuous solid wall thermal conduction path 30. The maximum tensile spring constant of the coil spring assumes that the walls of the coil spring extend up to the center axis around which the coil spring turns and that the individual coils touch the immediately neighboring coils. The resulting coil spring is almost a solid body. In further examples, such a coil spring has a tensile spring constant of "X" and the tensile spring constant of the tortuous solid wall thermal conduction path 30 is greater by a factor of at least one-hundred and, in further examples, by at least two-hundred.

Figure 2:
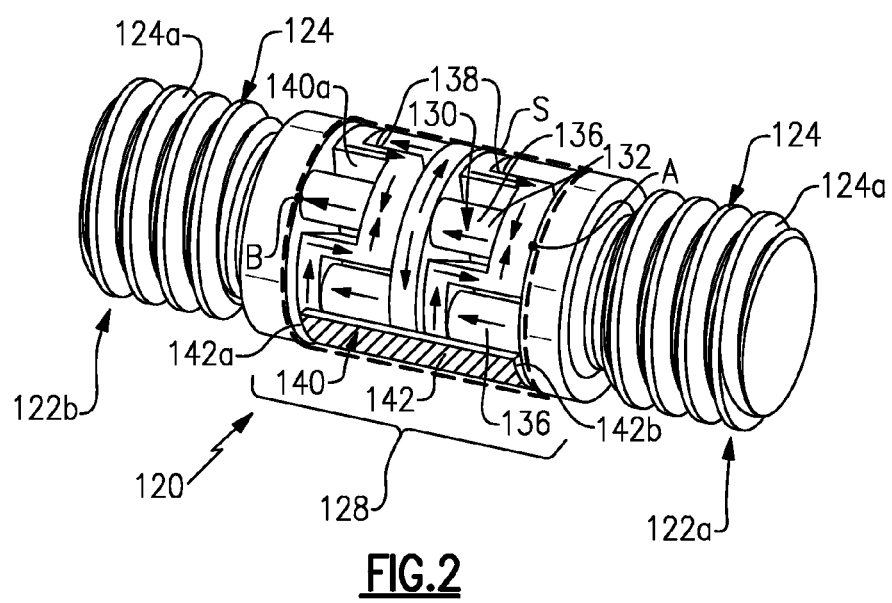
FIG. 2 illustrates another example article having a thermal stand-off section with a tortuous solid-wall thermal conduction path.

FIG. 2 illustrates another example article 120. In this disclosure, like reference numerals designate like elements where appropriate and reference numerals with the addition of one-hundred designate modified elements that are understood to incorporate the same features, functions, and benefits of the corresponding elements. In this example, the article 120 includes a thermal stand-off 122 that extends between first and second ends 122a/122b. The first and second ends 122a/122b each include a connector interface 124. The thermal stand-off 122 also includes a rigid thermal stand-off section 128 that is within a spatial region, again represented at S, between the first and second locations A, B. Similar to the article 20 of FIG. 1, the rigid thermal stand-off section 128 includes a tortuous solid wall thermal conduction path 130 provided by solid walls 132. The tortuous solid wall thermal conduction path 130 is longer than the distance of the spatial region.

In this example, the connector interfaces 124 include external threads 124a for joining a corresponding mating component to the article 120. As can be appreciated, the connector interfaces 124 need not necessarily be threaded and could alternatively be a different type of connector interface.

The solid walls 132 of the rigid thermal stand-off section 128 form the tortuous solid-wall thermal conduction path 130. In this example, the solid walls 132 wind around within the spatial region. Relative to heat conduction from the first end 122a toward the second end 122b through the rigid thermal stand-off section 128, the solid walls 132 have one or more antegrade sections 136 and, relative to the one or more antegrade sections 136, one or more retrograde sections 138. The one or more antegrade sections 136 provide a forward thermal conduction path from the first end 122a toward the second end 122b, and the one or more retrograde sections 138 provide a rearward thermal conduction path with respect to heat conduction from the first end 122a toward the second end 122b. The antegrade section 136 and retrograde section 138 can also be represented geometrically in that the path provided by the solid walls 132 has at least one back turn with respect to a path from a reference start location at the first location A to a reference end location at the second location B. The one or more antegrade sections 136 in combination with the one or more retrograde sections 138 provide a compact arrangement for increasing the thermal conduction path distance and thus providing thermal isolation.

As also shown in FIG. 2, the solid walls 132 define spaces 140 there between. The spaces 140 can be used to further enhance thermal isolation. For example, the spaces 140 can be left open such that the primary thermal conduction path is through the solid walls 132. Alternatively, some or all of the spaces 140 can be sealed and evacuated to further promote thermal conductivity through the solid walls 132. In a further example, the spaces 140 can be filled or partially filled with a phase-change material 140a that is capable of changing between two different phases over a design temperature differential across the article 120, such as between liquid-solid phases. In the article 120, the phase-change material can be used to absorb thermal energy and thus enhance the thermal stand-off effect provided by the rigid thermal stand-off section 128. One example phase-change material is a low melting temperature metal. One example metal is liquid sodium, but other liquids or solids that have phase changes within a given design temperature differential could alternatively be used.

Optionally, the article 120 can also include a sleeve 142 that fully or partially circumscribes the rigid thermal stand-off section 128 and extends over at least portion of the length, L. The sleeve 142 is cutaway in FIG. 2, but can circumscribe the rigid thermal stand-off section 128. In this example, the sleeve 142 extends from a connected base 142a at one side of the rigid thermal stand-off section 128 to a free end 142b that is distal from the side of the connected base 142a. Thus, the sleeve 142 is cantilevered from the connected base 142a and there is a gap provided at the free end 142b such that the primary thermal conduction path remains through the solid walls 132 of the rigid thermal stand-off section 128 rather than through the sleeve 142. That is, most of the heat conducted through the rigid thermal stand-off section 128 will be conducted through the solid walls 132 rather than over the open gap to the free end 142b. The outer surface of the sleeve 142 can also serve as a seal surface and, in one example, can receive an o-ring or similar seal, or include features for receiving or retaining a seal.

Figure 3:
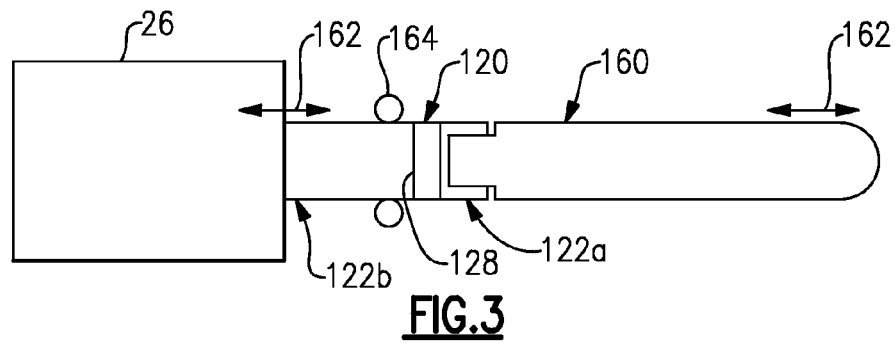
FIG. 3 illustrates an example implementation of an article having a tortuous solid-wall thermal conduction path.

FIG. 3 illustrates an example implementation of the article 120. In this example, the first end 122a of the article 120 includes an elongated probe 160 that is secured at the connector interface 124 to the article 120. Alternatively, the probe 160 can be integrated with or formed with the article 120 as a single, integrated piece.

The probe 160 can be a ceramic probe that is exposed in use to a high temperature environment or fluid. In this example, component 26 is an actuator that is interfaced with the connector interface 124 at the second end 122b and is operable to translate the article 120, and thus also the probe 160, along an axial direction, represented at 162. As an example, the probe 160 can be a needle, an injector element, or the like for modulating flow of a hot fluid, such as fuel. The probe 160 thus can be exposed to relatively high temperatures. The actuator, or other components that are in thermal communication with the article 120, such as seal 164, may be temperature-sensitive. In this regard, the article 120 insulates the actuator, the seal 164, or other component that would be connected to the article 120, from the high temperatures that the probe 160 is exposed to. That is, the relatively long thermal conduction path distance provided by the rigid thermal stand-off section 128 restricts thermal conduction between the probe 160 and the actuator, the seal 164, or other component connected to the article 120. In this regard, the article 120 (or 20) could be used to lower the exposure temperature of a connected component, which can extend the life of that component, or permit an increase in the temperature that a connected component is exposed to without a corresponding increase in temperature exposure of another connected component.

The article 20/120 can be fabricated using additive manufacturing, three-dimensional printing, machining, and/or diffusion bonding, but is not limited to any particular technique. The selected fabrication technique may depend, at least to some extent, upon the selected geometry of the solid walls 32/132.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A thermal stand-off comprising:
   a rigid thermal stand-off section within a spatial region extending along a distance between a first location and second, opposed location,
   the rigid thermal stand-off section including a tortuous solid-wall thermal conduction path extending from the first location to the second location,
   the tortuous solid-wall thermal conduction path being longer than the distance of the spatial region,
   wherein the tortuous solid-wall thermal conduction path includes an antegrade section and, relative the antegrade section, a retrograde section,
   wherein the antegrade section and the retrograde section provide a back turn with respect to a reference start location at the first location and a reference end location at the second location
   a sleeve extending around the rigid thermal stand-off section, the sleeve extending from one side of the rigid thermal stand-off section at least partially over the length.

2. A thermal stand-off comprising:
   a rigid thermal stand-off section within a spatial region extending along a distance between a first location and second, opposed location,
   the rigid thermal stand-off section including a tortuous solid-wall thermal conduction path extending from the first location to the second location,
   the tortuous solid-wall thermal conduction path being longer than the distance of the spatial region,
   wherein the tortuous solid-wall thermal conduction path includes an antegrade section and, relative the antegrade section, a retrograde section,
   wherein the antegrade section and the retrograde section provide a back turn with respect to a reference start location at the first location and a reference end location at the second location
   a sleeve extending around the rigid thermal stand-off section and partially over the length, the sleeve extending from a connected base at the one side of the rigid thermal stand-off section to a free end distal from the one side of the rigid thermal stand-off section.

* * * * *